US009226406B2

(12) United States Patent
Yamamoto et al.

(10) Patent No.: US 9,226,406 B2
(45) Date of Patent: Dec. 29, 2015

(54) ELECTRODE CONNECTION METHOD, ELECTRODE CONNECTION STRUCTURE, CONDUCTIVE ADHESIVE USED THEREFOR, AND ELECTRONIC DEVICE

(75) Inventors: Masamichi Yamamoto, Osaka (JP); Kyouichirou Nakatsugi, Osaka (JP); Yasuhiro Okuda, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 1041 days.

(21) Appl. No.: 13/377,998

(22) PCT Filed: Jun. 4, 2010

(86) PCT No.: PCT/JP2010/059497
§ 371 (c)(1),
(2), (4) Date: Dec. 13, 2011

(87) PCT Pub. No.: WO2010/147001
PCT Pub. Date: Dec. 23, 2010

(65) Prior Publication Data
US 2012/0085580 A1    Apr. 12, 2012

(30) Foreign Application Priority Data

Jun. 15, 2009  (JP) ................................ 2009-142258

(51) Int. Cl.
| | | |
|---|---|---|
| B32B 9/04 | (2006.01) |
| H05K 3/32 | (2006.01) |
| C09J 9/02 | (2006.01) |
| H05K 3/36 | (2006.01) |
| H05K 3/28 | (2006.01) |

(52) U.S. Cl.
CPC . *H05K 3/323* (2013.01); *C09J 9/02* (2013.01); *H05K 3/361* (2013.01); *H01L 2924/01005* (2013.01); *H01L 2924/01027* (2013.01); *H01L 2924/01078* (2013.01); *H01L 2924/01079* (2013.01); *H05K 3/282* (2013.01); *H05K 2201/023* (2013.01); *H05K 2201/0379* (2013.01); *Y10T 156/10* (2015.01)

(58) Field of Classification Search
None
See application file for complete search history.

(56) References Cited

U.S. PATENT DOCUMENTS

| | | | |
|---|---|---|---|
| 5,600,103 A | 2/1997 | Odaira et al. | |
| 5,891,366 A * | 4/1999 | Gruenwald et al. | 252/514 |
| 8,470,438 B2 * | 6/2013 | Yamamoto et al. | 428/323 |
| 2005/0173678 A1 | 8/2005 | Miura et al. | |
| 2006/0023154 A1 * | 2/2006 | Harada et al. | 349/149 |

FOREIGN PATENT DOCUMENTS

| | | |
|---|---|---|
| CN | 1714131 A | 12/2005 |
| CN | 101360354 A | 2/2009 |
| JP | 04-051592 | 2/1992 |
| JP | 04-159794 | 6/1992 |
| JP | 04-162693 | 6/1992 |
| JP | 06-051337 | 2/1994 |
| JP | 06-052715 | 2/1994 |
| JP | 07-029419 | 1/1995 |
| JP | 07-133466 A | 5/1995 |
| JP | 08-319467 | 12/1996 |
| JP | 10-079568 | 3/1998 |
| JP | 11-241054 | 9/1999 |
| JP | 2000-086981 | 3/2000 |
| JP | 2000-129216 | 5/2000 |
| JP | 2001-345544 | 12/2001 |
| JP | 2002-299809 | 10/2002 |
| JP | 2003-064324 | 3/2003 |
| JP | 2005-068530 | 3/2005 |
| JP | 2005-116291 A | 4/2005 |
| JP | 2006-041374 | 2/2006 |
| JP | 2006-257408 A | 9/2006 |
| JP | 2007-059451 | 3/2007 |
| JP | 2007-238751 | 9/2007 |
| JP | 2008-004429 | 1/2008 |
| JP | 2008-078384 | 4/2008 |
| JP | 2008-094908 | 4/2008 |
| JP | 2008-097922 | 4/2008 |
| JP | 2008097922 A | 4/2008 |
| JP | 2008-308519 | 12/2008 |
| JP | 2009-038002 | 2/2009 |
| JP | 2009-038732 | 2/2009 |
| JP | 2009-088454 | 4/2009 |
| WO | 2004055126 A1 | 7/2004 |
| WO | WO 2008/105397 A1 | 9/2008 |

OTHER PUBLICATIONS

Notification of the First Office Action from the State Intellectual Property Office issued in Chinese Patent Application No. 201080026662.6 and its English Translation mailed Oct. 14, 2013.
Office Action issued in related U.S. Appl. No. 13/139,926, mailed on Sep. 13, 2012.
Notice of Allowance issued in related U.S. Appl. No. 13/139,926, mailed on Feb. 27, 2013.

(Continued)

*Primary Examiner* — Sheeba Ahmed
(74) *Attorney, Agent, or Firm* — McDermott Will & Emery LLP

(57) ABSTRACT

By connecting together connecting electrodes having an organic film serving as an oxidation-preventing film using a conductive adhesive, the manufacturing process can be simplified, and a highly reliable connection structure can be constructed at low cost. An electrode connection method, in which a first connecting electrode 2 and a second connecting electrode 10 are connected together through a conductive adhesive 9 that is interposed between the electrodes, includes an organic film formation step in which an organic film 6 is formed on at least a surface of the first connecting electrode, and an electrode connection step in which the first connecting electrode and the second connecting electrode are connected together through the conductive adhesive. In the electrode connection step, by allowing an organic film decomposing component mixed in the conductive adhesive to act on the organic film, the organic film is decomposed, and thus connection between the connecting electrodes is performed.

13 Claims, 6 Drawing Sheets

(56) References Cited

OTHER PUBLICATIONS

Chinese Office Action issued in Chinese Application No. 201080026662.6 dated Mar. 24, 2014, w/English translation.

Japanese Office Action issued in Application No. 2010-253491 dated Jun. 11, 2013.

Japanese Notification of Reasons for Rejection, with English Translation, issued in Japanese Patent Application No. 2009-142258, dated Sep. 14, 2010.

Japanese Notification of Reasons for Rejection, with English Translation, issued in Japanese Patent Application No. 2009-142258, dated Mar. 10, 2011.

Japanese Examiner's Decision of Dismissal of Amendment, with English Translation, issued in Japanese Patent Application No. 2009-142258, dated Jun. 1, 2011.

Japanese Examiner's Decision of Refusal, with English Translation, issued in Japanese Patent Application No. 2009-142258, dated Jun. 1, 2011.

International Search Report issued in International Patent Application No. PCT/JP2010/059497, mailed Aug. 31, 2010.

U.S. Appl. No. 13/139,926, filed on Jun. 15, 2011.

Japanese Office Action, with partial English translation, issued in Japanese Patent Application No. 2009-142283, mailed Aug. 24, 2010.

Japanese Office Action, with partial English translation, issued in Japanese Patent Application No. 2009-142283, mailed Apr. 27, 2011.

* cited by examiner

ELECTRODE CONNECTION METHOD, ELECTRODE CONNECTION STRUCTURE, CONDUCTIVE ADHESIVE USED THEREFOR, AND ELECTRONIC DEVICE

RELATED APPLICATIONS

This application is the U.S. National Phase under 35 U.S.C. §371 of International Application No. PCT/JP2010/059497, filed on Jun. 4, 2010, which in turn claims the benefit of Japanese Application No. 2009-142258, filed on Jun. 15, 2009, the disclosures of which Applications are incorporated by reference herein.

TECHNICAL FIELD

The present invention relates to an electrode connection method in which electrical connection is obtained by means of a conductive adhesive, an electrode connection structure, a conductive adhesive used therefor, and an electronic device.

BACKGROUND ART

In recent years, with the reduction in the size of electronic devices and the increase in functionality, connection terminals in components (e.g., electronic components in liquid crystal products) have been miniaturized. Consequently, in the field of mounting electronics, as a conductive adhesive that can easily connect between such terminals, film-shaped adhesives are widely used. The conductive adhesive is used, for example, for connection between a printed circuit board or printed wiring board, such as a flexible printed wiring board or flexible printed circuit board (FPC) or a rigid printed wiring board or rigid printed circuit board (PWB or PCB) provided with connecting electrodes made of copper electrodes, and a circuit board or wiring board, such as a glass substrate provided with connecting electrodes, such as copper electrodes, and for connection between a printed circuit board or printed wiring board and electronic components, such as IC chips.

The conductive adhesive is an adhesive having anisotropic conductivity in which conductive particles are orientationally dispersed in an insulating resin composition. The conductive adhesive is interposed between adherends, and heat and pressure are applied thereto. When heat and pressure are applied, the resin in the adhesive flows and seals the surfaces of electrodes, and at the same time, bonding is performed such that some of conductive particles are grasped between electrodes which face each other to achieve electrical connection. Conventionally, gold plating is performed on the surface of a connecting electrode provided on a printed circuit board or the like in order to prevent oxidation and to ensure conductivity.

CITATION LIST

Patent Literature

PTL 1: Japanese Unexamined Patent Application Publication No. 10-79568

SUMMARY OF INVENTION

Technical Problem

In the conventional technique, a nickel plating layer is formed on the surface of the connecting electrode made of copper or the like, and the gold plating layer is formed thereon. Therefore, the electrode manufacturing process becomes complicated, and the manufacturing costs for a circuit board having the electrode and an electronic device including the circuit board increase, all of which are problems.

In the case where a connecting electrode is not subjected to gold plating, the wiring base material, such as copper, constituting the electrode is exposed, and thus oxidation occurs easily, causing a hindrance in connecting the electrode. Consequently, instead of the gold plating, an organic film for oxidation prevention is formed in many cases. The organic film is formed by subjecting the surface of the connecting electrode to water-soluble preflux treatment (OSP: organic solderability preservation). The water-soluble preflux is an acid aqueous solution containing an azole compound, and the organic film is formed on the electrode surface with a complex therebetween.

In the meantime, in an electronic component connection step in which an electronic component is connected to an electronic component-connecting electrode of a circuit board, a solder reflow process is employed in many cases. In the solder reflow process, a lead-free solder is applied by coating or the like to the surface of the electronic component-connecting electrode of the circuit board, an electronic component is mounted thereon, and the circuit board is placed in a reflow furnace. Then, a connecting electrode of a flexible printed circuit board or the like for wiring is connected, using the conductive adhesive, to the connecting electrode of the circuit board to which the electronic component has been connected. In this case, as shown in FIG. 7, electrical connection is performed such that conductive particles 8 in the conductive adhesive 9 break through the organic films 6 and 11 formed on the surfaces of the connecting electrodes 2 and 10.

However, in the solder reflow process, the organic film 6 is often hardened by the action of heat. Consequently, there is a possibility that conductive particles 8 in the conductive adhesive 9 may become unable to break through the organic film 6, resulting in occurrence of connection failure. On the other hand, in the case where the organic film 6 is not formed, the surface of the connecting electrode 2 becomes oxidized, resulting in connection failure or the like.

The present invention has been devised to solve the problems described above, and it is an object of the present invention to provide an electrode connection method in which by connecting together connecting electrodes having an organic film serving as an oxidation-preventing film using a conductive adhesive, the manufacturing process can be simplified, and a highly reliable electrode connection structure can be constructed at low cost, an electrode connection structure, a conductive adhesive used therefor, and an electronic device.

Solution to Problem

The invention of claim 1 of the present application provides an electrode connection method in which a first connecting electrode and a second connecting electrode are connected together through a conductive adhesive that is interposed between the electrodes, the method including an organic film formation step in which an organic film is formed on at least a surface of the first connecting electrode, and an electrode connection step in which the first connecting electrode and the second connecting electrode are connected together through the conductive adhesive. In the electrode connection step, by allowing an organic film decomposing component mixed in the conductive adhesive to act on the organic film, the organic film is decomposed, and thus connection between the connecting electrodes is performed.

In the present invention, since the organic film decomposing component is mixed in the conductive adhesive, connection can be performed by decomposing part or all of the organic film when the electrodes are connected together. Consequently, conductive particles in the conductive adhesive easily break through the organic film so as to be bitten into the electrode, and electrical connection between the connecting electrodes can be reliably obtained.

In particular, as in the invention of claim 2, in the case where the first connecting electrode is formed on a circuit board on which an electronic component is to be mounted, and the method includes, after the organic film formation step, an electronic component connection step in which the electronic component is connected to the circuit board by a solder reflow process, the organic film is often hardened.

By employing the present invention, even in the case where a hardened organic film is present, the strength can be decreased by decomposing the organic film or by decomposing part of the hardened organic film. Therefore, connection between the connecting electrodes can be reliably performed.

Moreover, since oxidation of the connecting electrode can be prevented by the organic film, the manufacturing costs for electrical devices and the like can be greatly reduced compared with the conventional case where gold plating is performed. Furthermore, by performing the solder reflow step in a nonoxidizing atmosphere, oxidation of the electrodes can be prevented during the step, and connection between the connecting electrodes can be more reliably performed.

The electrode to which the connection method according to the present invention is applied and the circuit board or the like provided with the electrode are not particularly limited, as long as the electrode is provided with an organic film for oxidation prevention. For example, the electrode connection method according to the present invention can be applied to not only to an electrode provided on a printed circuit board or the like, but also to the case where an electrode of an electronic component is connected.

Furthermore, the present invention can be applied not only to the electrode with the organic film of which is hardened by performing a solder reflow process, but also to connection of a connecting electrode of a circuit board or an electronic component which is not subjected to a solder reflow process. Since the strength of the organic film can be decreased at the time of electrode connection, it is also possible to use an organic film in which oxidation resistance is enhanced by increasing the thickness of the organic film.

The type of the organic film to which the electrode connection method according to the present invention can be applied is not particularly limited. The water-soluble preflux treatment is performed, for example, by the action of an acid aqueous solution containing an azole compound. Examples of the azole compound that can be used include imidazole, 2-undecylimidazole, 2-phenylimidazole, 2,2,4-diphenylimidazole, triazole, aminotriazole, pyrazole, benzothiazole, 2-mercaptobenzothiazole, benzimidazole, 2-butyl benzimidazole, 2-phenylethyl benzimidazole, 2-naphthyl benzimidazole, 5-nitro-2-nonyl benzimidazole, 5-chloro-2-nonyl benzimidazole, 2-amino benzimidazole, benzotriazole, hydroxybenzotriazole, and carboxyl benzotriazole.

Furthermore, an organic film containing at least one organic compound selected from 2-phenylimidazoles, such as 2-phenyl-4-methyl-5-benzyimidazole, 2,4-diphenylimidazole, and 2,4-diphenyl-5-methylimidazole, and benzimidazoles, such as 5-methyl benzimidazole, 2-alkyl benzimidazole, 2-aryl benzimidazole, and 2-phenyl benzimidazole, has high heat resistance, and thus has a high function of preventing oxidation, which is suitable.

The average thickness of the organic film is preferably 0.05 µm or more. When the average thickness of the organic film is less than 0.05 µm, it is difficult to maintain the oxidation preventing function of the organic film, and the surface of the connecting electrode may be oxidized. On the other hand, in the present invention, since the organic film can be decomposed at the time of electrode connection, it is also possible to use an organic film having a large thickness that can reliably prevent the oxidation of the electrode.

As in the invention of claim 3, preferably, a resin component having at least one of a carboxyl group, a mercapto group, and a sulfo group is used as the organic film decomposing component.

As the resin component having the carboxyl group, for example, a methacrylic resin (acrylic resin), a carboxylated polyester resin, a carboxylated nitrile-butadiene rubber, or the like can be used. As the resin composition having the mercapto group or the sulfo group, for example, a mercapto group-containing polyvinyl alcohol, a sulfo group-containing polyvinyl alcohol, or the like can be used. The carboxyl group, the mercapto group, and the sulfo group act on the organic film lying on the surface of the electrode to decompose the organic film in the electrode connection step.

Furthermore, as in the invention of claim 4, it is also possible to mix a resin component that generates the carboxyl group by heating. For example, in the case where an epoxy resin is used as the base material of the conductive adhesive, by using an acid anhydride-base curing agent and by heating, the carboxyl group can be generated. A carboxylic acid anhydride is a compound produced by dehydration synthesis of two carboxylic acid molecules, and has the carboxyl group. By using a curing agent containing a carboxylic acid anhydride, such as maleic acid anhydride, phthalic anhydride, succinic anhydride, or pyromellitic dianhydride, and by heating the adhesive in the bonding step, the organic film can be decomposed by the action of the generated carboxyl group.

Furthermore, in the case where a resin component containing the carboxylic acid anhydride is used, by mixing a resin component containing a tertiary amine group or an imidazole group, the carboxy group formation reaction can be promoted.

The invention of claim 5 provides an electrode connection structure in which a first connecting electrode and a second connecting electrode are connected together through a conductive adhesive, the electrode connection structure including an organic film formed on at least the first connecting electrode, and a conductive adhesive layer disposed between the connecting electrodes, in which the conductive adhesive layer contains the organic film decomposing component.

As in the invention of claim 6, the conductive adhesive can include an adhesive component containing a thermosetting resin, conductive particles, and an organic film decomposing component which decomposes an organic film disposed on a connecting electrode.

As the adhesive component, an adhesive component which includes, as a major component, a thermosetting resin to which a curing agent and a filler of any of various types are added can be used. As the thermosetting resin, for example, an epoxy resin, a phenol resin, a polyurethane resin, an unsaturated polyester resin, a urea resin, a polyimide resin, or the like can be used.

As the organic film decomposing component, preferably, a resin component having a carboxyl group is used. The carboxyl group acts as an acid and can decompose the organic film. The organic film is not necessarily completely decomposed, and it is sufficient to decrease the film strength of the organic film to such an extent that conductive particles can break through the organic film.

Furthermore, as in the invention of claim 7, the conductive adhesive can contain a resin component which generates the organic film decomposing component by heating. For example, it is possible to use a resin component containing a carboxylic acid anhydride, such as maleic acid anhydride, phthalic anhydride, succinic anhydride, pyromellitic dianhydride or the like.

The form of the conductive particles is not particularly limited. For example, as in the invention of claim 8, it is preferable to use conductive particles composed of metal powder having a form in which many fine metal particles are linearly joined to each other or having an acicular shape.

By using the conductive particles having such a form, short-circuiting can be prevented by maintaining insulation between adjacent electrodes in the bonding surface direction of the conductive adhesive layer, while electrical connection can be secured through many conductive particles in the thickness direction. Consequently, reliability of electrical connection between the connecting electrodes improves.

Furthermore, as in the invention of claim 9, it is preferable to use conductive particles having an aspect ratio of 5 or more. In this claim, the aspect ratio is defined as the ratio between the average minor axis length and the average major axis length of the conductive particles.

When conductive particles having an aspect ratio of 5 or more are used, the probability of electrode contact increases when the conductive adhesive is used. As a result, electrical connection of the electrodes can be secured without increasing the amount of conductive particles to be mixed.

The form of the conductive adhesive is not particularly limited. For example, a liquid adhesive having fluidity is used, and by coating the adhesive onto the electrode, the adhesive layer can be formed.

Furthermore, as in the invention of claim 10, it is possible to use a film-shaped conductive adhesive.

Handling is facilitated by use of a film-shaped conductive adhesive, and workability improves at the time of connecting the electrodes by performing heat compression treatment with the adhesive therebetween.

In the invention of claim 11, in the film-shaped adhesive, the organic film decomposing component is unevenly distributed and concentrated on at least a portion to be brought into contact with the organic film.

By unevenly distributing the organic film decomposing component so as to be concentrated on the portion to be brought into contact with the organic film, the organic film can be efficiently decomposed.

The method of unevenly distributing the organic film decomposing component so as to be concentrated on the portion to be brought into contact with the organic film is not particularly limited. For example, in the case where a film-shaped adhesive containing, as a base compound, an epoxy resin is used, by stacking a resin film having the organic film decomposing component onto the surface to be brought into contact with the organic film, a multilayered film-shaped conductive adhesive can be formed.

Furthermore, by applying a resin containing the organic film decomposing component by coating onto the surface of the film-shaped conductive adhesive to be brought into contact with the organic film, the organic film decomposing component becomes unevenly distributed and concentrated on the organic film contact surface. Furthermore, it is also possible to use a film-shaped adhesive provided with a concentration gradient such that the concentration of the organic film decomposing component is high in the vicinity of the organic film contact surface.

In the invention of claim 12, the major axis direction of the conductive particles is aligned in the thickness direction of the film-shaped adhesive.

By aligning the conductive particles as described above, while preventing short-circuiting by maintaining insulation between adjacent connecting electrodes, many pairs of electrodes can be conductively connected at a time and each independently.

The invention of claim 13 relates to an electronic device having an electrode connection structure in which electrodes having an organic film are connected together by means of the conductive adhesive according to claim 6.

The conductive adhesive, the electrode connection method, and the like according to the present invention can be applied to electrode connection structures, for example, members used in electronic devices, such as cell-phones, cameras, e.g., digital cameras and video cameras, portable audio players, portable DVD players, and notebook-size personal computers.

Advantageous Effects of Invention

By employing the electrode connection method according to the present invention, the process of manufacturing electrodes can be simplified, thereby reducing the manufacturing cost, and reliable electrical connection between electrodes can be secured.

DESCRIPTION OF EMBODIMENTS

Figure 1:
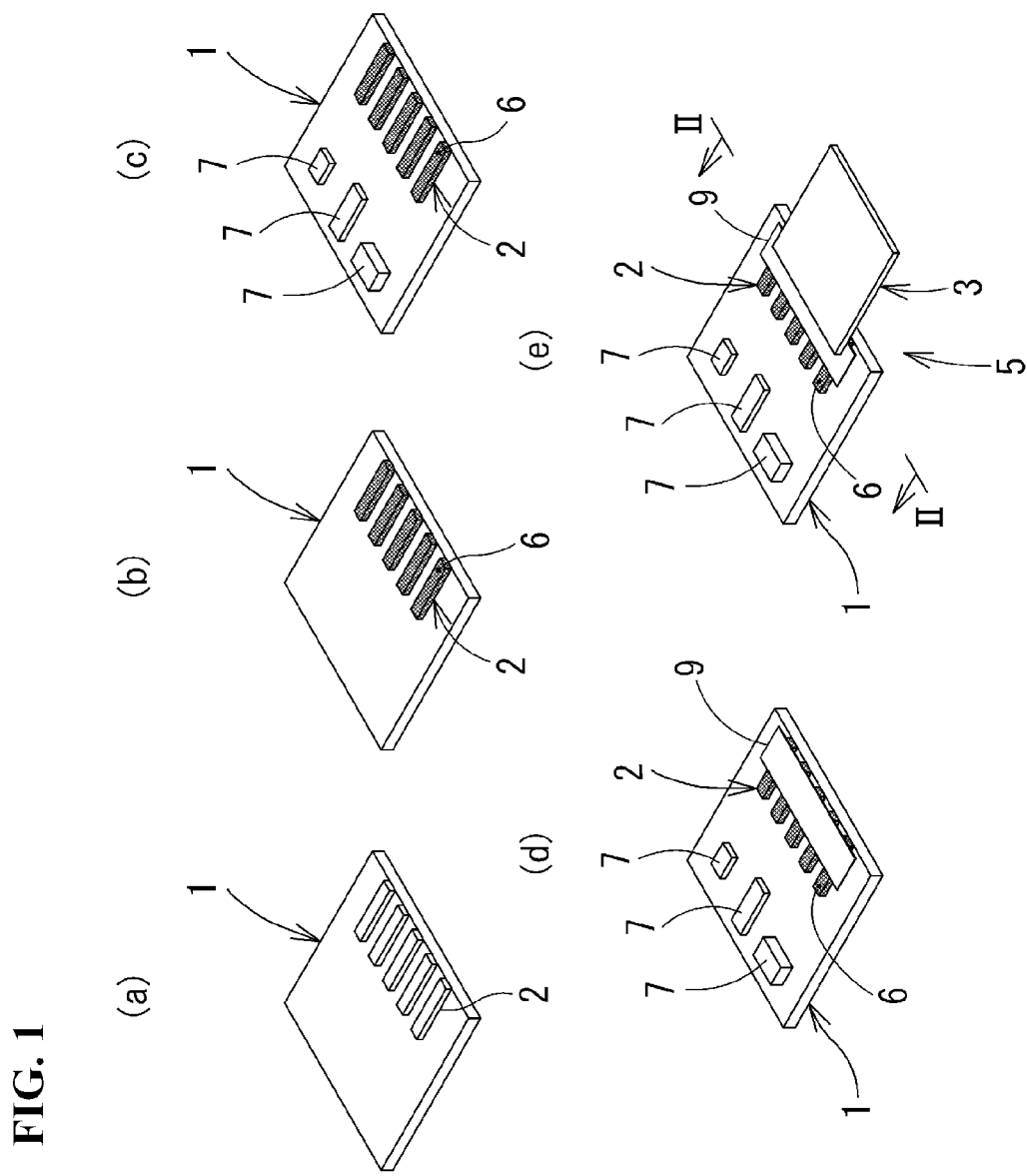
FIG. 1 is a view showing schematic steps in a connection method according to the present invention.

FIGS. 1(*a*) to 1(*e*) show schematic steps in a connection method according to the present invention. In this embodiment, an electrode connection method according to the present invention is applied to the case where connecting electrodes 2 of a rigid printed circuit board 1 in which electronic components 7 are connected using a solder reflow process are connected to connecting electrodes 11 of a flexible printed circuit board 3 for wiring.

As shown in FIG. 1(*a*), wiring connecting electrodes 2 are disposed on the edge of a rigid printed circuit board 1. As shown in FIG. 1(*b*), an organic film formation step is performed in which an organic film 6 serving as an oxidation-preventing film is formed so as to cover the surfaces of the wiring connecting electrodes 2. Although not shown in the drawing, the organic film may be formed on electrodes for mounting electronic components of the rigid printed circuit board 1.

The organic film 6 is formed by subjecting the surfaces of the electrodes to water-soluble preflux treatment (OSP: organic solderability preservation).

The water-soluble preflux treatment is performed by the action of an acid aqueous solution containing an azole compound. Examples of the azole compound include imidazole, 2-undecylimidazole, 2-phenylimidazole, 2,2,4-diphenylimidazole, triazole, aminotriazole, pyrazole, benzothiazole, 2-mercaptobenzothiazole, benzimidazole, 2-butyl benzimidazole, 2-phenylethyl benzimidazole, 2-naphthyl benzimidazole, 5-nitro-2-nonyl benzimidazole, 5-chloro-2-nonyl benzimidazole, 2-amino benzimidazole, benzotriazole, hydroxybenzotriazole, and carboxyl benzotriazole.

Furthermore, an organic film containing at least one organic compound selected from 2-phenylimidazoles, such as 2-phenyl-4-methyl-5-benzyimidazole, 2,4-diphenylimidazole, and 2,4-diphenyl-5-methylimidazole, and benzimidazoles, such as 5-methyl benzimidazole, 2-alkyl benzimidazole, 2-aryl benzimidazole, and 2-phenyl benzimidazole, has high heat resistance, and thus has a high function of preventing oxidation, which is suitable.

As the method for performing water-soluble preflux treatment on the surfaces of the connecting electrodes 2, for example, a spray method, a shower method, a dipping method, or the like is used. Subsequently, by performing water washing and drying, the organic film 6 is formed. The temperature of the water-soluble preflux is preferably 25° C. to 40° C., and the contact time between the water-soluble preflux and the electrodes 2 is preferably 30 to 60 seconds.

The thickness of the resulting organic film 6 is preferably 0.05 μm or more. When the thickness of the organic film is less than 0.05 μm, it is not possible to secure a sufficient function of preventing oxidation. On the other hand, in the present invention, since the organic film can be decomposed at the time of electrode connection, it is also possible to use an organic film having a large thickness that can reliably prevent the oxidation of electrodes.

By forming the organic film 6, the connecting electrodes 2 can be prevented from being oxidized in the electronic component connection step and the like. Furthermore, unlike the conventional case, it is not necessary to subject electrodes to gold plating, and therefore, the manufacturing cost can be reduced by simplifying the manufacturing process.

After the water-soluble preflux treatment is performed, electronic components 7 are connected to the rigid printed circuit board 1. In this embodiment, a lead-free solder is applied by a printing method or the like to the surfaces of electronic component-connecting electrodes (not shown) on the rigid printed circuit board 1, electronic components 7 are mounted thereon, and then the rigid printed circuit board 1 is placed in a reflow furnace. Thereby, the electronic components 7 are connected to predetermined electrodes.

Furthermore, the electronic component-connecting electrodes may be subjected to gold plating, and the electronic components may be mounted thereon. After the water-soluble preflux treatment is performed in the same manner as that for the connecting electrodes described above, electronic components may be connected by the same method as that for the connecting electrodes which will be described later. Furthermore, electronic components and the like connected with a solder and electronic components and the like connected with an adhesive may coexist. In this case, after the connection step with the solder, the connection step with the adhesive is performed.

After the electronic components 7 are connected by the solder reflow process, electrodes of the flexible printed circuit board 3 for wiring are connected to the connecting electrodes 2 of the rigid printed circuit board 1.

Figure 2:
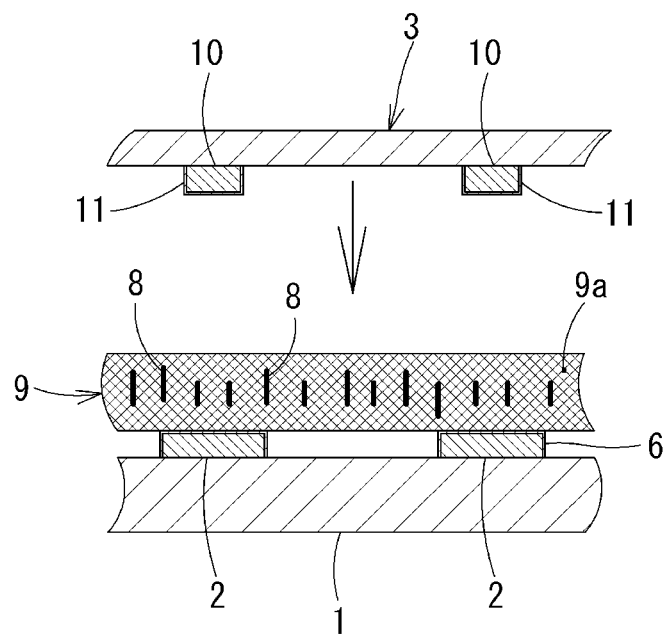
FIG. 2 is an enlarged cross-sectional view taken along the line II-II of FIG. 1(*e*) which shows a connection step.

As shown in FIG. 1(d) and FIG. 2, in this embodiment, a film-shaped conductive adhesive 9 which contains an insulating thermosetting resin, such as an epoxy resin, as a major component, a latent curing agent, and conductive particles 8 is placed on the surfaces of the wiring connecting electrodes 2 of the rigid printed circuit board 1. With the conductive adhesive 9 being heated to a predetermined temperature, by applying a predetermined pressure toward the rigid printed circuit board 1, the conductive adhesive 9 is temporarily bonded onto the connecting electrodes 2. It is also possible to apply a paste conductive adhesive as the conductive adhesive 9 to the surfaces of the electrodes provided with the organic film 6.

Next, as shown in FIG. 2, with the connecting electrodes 10 of the flexible printed circuit board 3 for wiring being directed downward, the connecting electrodes 2 disposed on the surface of the rigid printed circuit board 1 are aligned with the connecting electrodes 10 of the flexible printed circuit board 3, and the flexible printed circuit board 3 is placed on the rigid printed circuit board 1.

In this embodiment, an organic film 11 for oxidation prevention is formed on the surfaces of the connecting electrodes 10 of the flexible printed circuit board 3 by performing water-soluble preflux treatment as in the connecting electrodes 2 of the rigid printed circuit board 1.

Subsequently, with the conductive adhesive 9 being heated to a predetermined temperature, the rigid printed circuit board 1 and the flexible printed circuit board 3 are compressed against each other under a predetermined pressure. Thereby, the connecting electrodes 2 of the rigid printed circuit board 1 and the connecting electrodes 10 of the flexible printed circuit board 3 are compression bonded to each other with the conductive adhesive 9 therebetween. The base material 9a is briefly softened because the conductive adhesive 9 contains a thermosetting resin as a major component, but the conductive adhesive 9 is cured by continuous heating. When a preset curing time elapses, the pressurization is released and cooling is performed. Thereby, the connecting electrodes 2 of the rigid printed circuit board 1 and the connecting electrodes 10 of the flexible printed circuit board 3 are connected to each other through the conductive adhesive 9 while securing electrical conduction.

Figure 3:
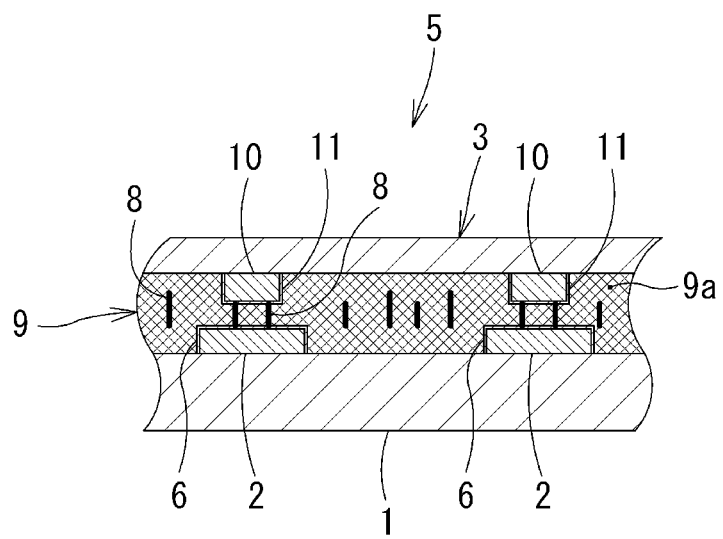
FIG. 3 is an enlarged cross-sectional view of a connection structure according to the present invention.
Figure 4:
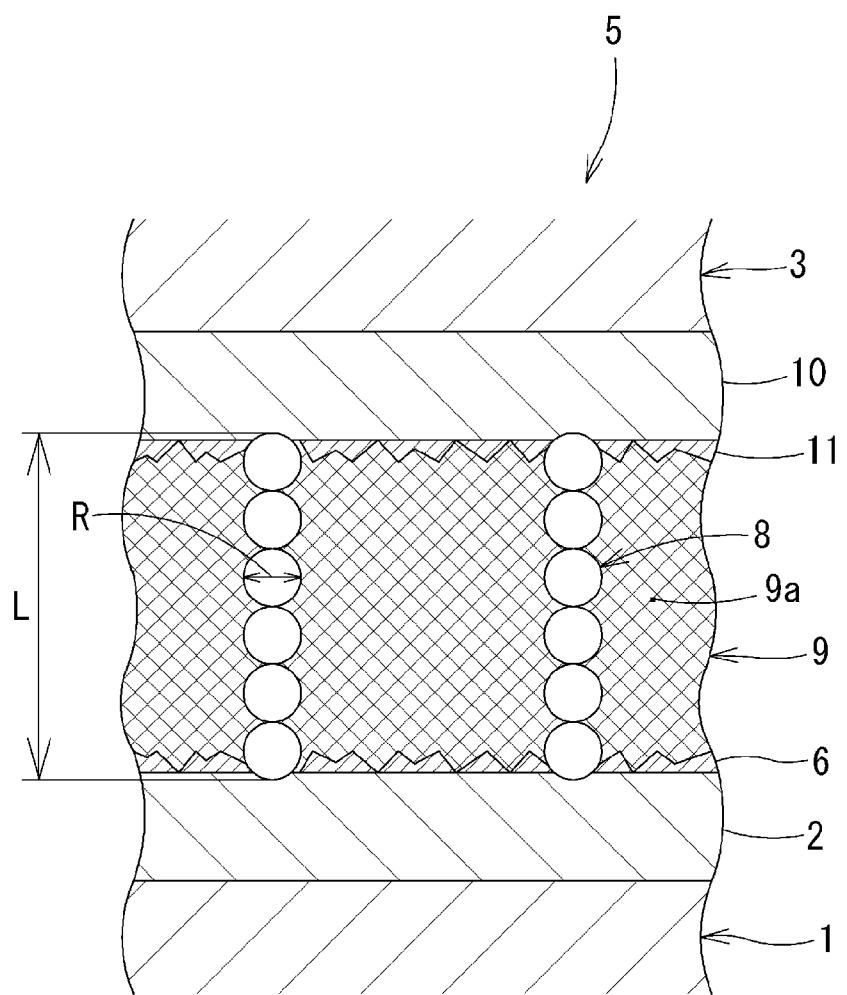
FIG. 4 is an enlarged cross-sectional view schematically showing the connection structure shown in FIG. 3.

FIG. 3 is a cross-sectional view taken along the line II-II of FIG. 1(e). FIG. 4 is an enlarged cross-sectional view schematically showing the cross-section of the connection structure shown in FIG. 3.

As shown in these drawings, in the conductive adhesive 9 according to this embodiment, the conductive particles 8 have a form in which many fine metal particles are linearly joined to each other or the conductive particles 8 have an acicular shape. By using metal particles having such a form, short-circuiting can be prevented by maintaining insulation between the adjacent connecting electrodes 2 of the rigid printed circuit board 1 or between the connecting electrodes 10 provided on the flexible printed circuit board 3 in the planar direction of the film-shaped conductive adhesive 9, while many pairs of opposing electrodes 2 and 10 can be conductively connected at a time and each independently in the thickness direction of the conductive adhesive 9.

In the conductive particles 8 according to this embodiment, the aspect ratio is set at 5 or more. By setting the aspect ratio at 5 or more, the probability of electrode contact increases when the conductive adhesive 9 is used. Consequently, while achieving electrical connection between the connecting electrodes without increasing the amount of conductive particles 8, the electrodes can be connected to each other. The term "aspect ratio" is defined as the ratio between the average minor axis length (average value of length R of the cross-section of the conductive particles 8) and the average major axis length (average value of the length L of the conductive particles 8) of the conductive particles 8 shown in FIG. 4.

Furthermore, in this embodiment, a film-shaped conductive adhesive is used as the conductive adhesive 9. By using a film-shaped adhesive, handling of the adhesive is facilitated, and the heating/pressurizing treatment can be easily performed.

Furthermore, in the conductive adhesive 9 according to this embodiment, the major axis direction of the conductive particles having the aspect ratio described above is aligned in the thickness direction of the film-shaped adhesive. By using this structure, while preventing short-circuiting by maintaining insulation between adjacent connecting electrodes 2 of the rigid printed circuit board 1 or between adjacent connecting electrodes 10 of the flexible printed circuit board 3, many pairs of opposing electrodes can be conductively connected at a time and each independently.

Figure 7:
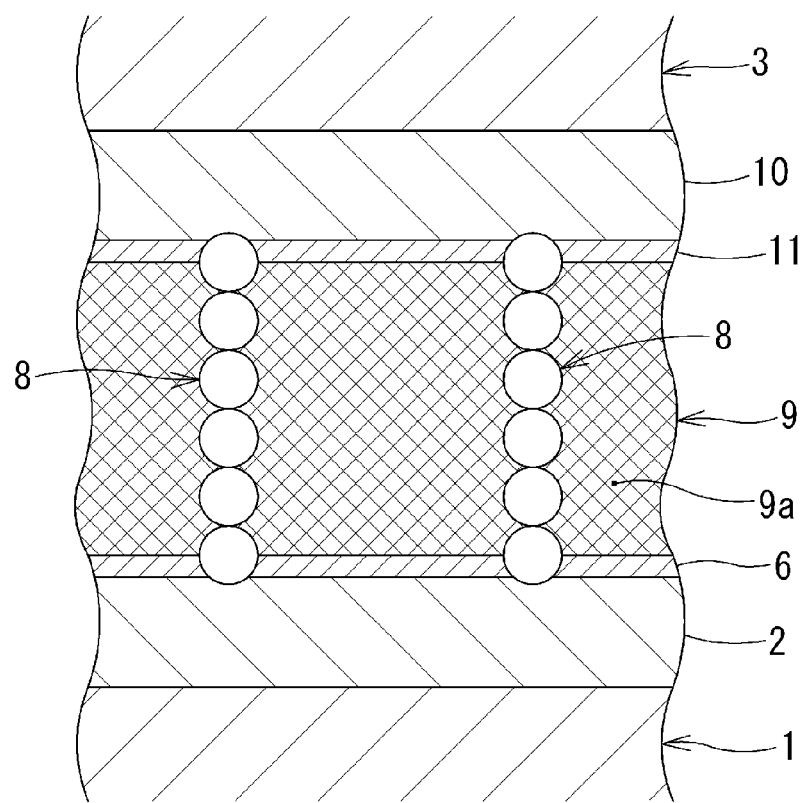
FIG. 7 is an enlarged cross-sectional view schematically showing an electrode connection structure formed without using a conductive adhesive according to the present invention.

In the meantime, as described above, in this embodiment, after the organic film 6 is formed, a solder reflow process is performed in order to connect the electronic components 7. As a result, the organic film 6 formed on the connecting electrodes 2 of the rigid printed circuit board 1 is hardened by the action of heat in the reflow furnace. Consequently, there is a possibility that the conductive particles 8 may become unable to break through the organic film 6 so as to be sufficiently in contact with the connecting electrodes 6, and a connecting structure such as the one shown in FIG. 7 may not be formed.

In this embodiment, in order to overcome the problem described above, an organic film decomposing component which decomposes the organic films 6 and 11 is mixed into the conductive adhesive 9.

As the organic film decomposing component, a resin component having at least one of a carboxyl group, a mercapto group, and a sulfo group can be used.

As the resin component having the carboxyl group, for example, a methacrylic resin (acrylic resin), a carboxylated polyester resin, a carboxylated nitrile-butadiene rubber, or the like can be used. As the resin composition having the mercapto group or the sulfo group, for example, a mercapto group-containing polyvinyl alcohol, a sulfo group-containing polyvinyl alcohol, or the like can be used. The carboxyl group, the mercapto group, and the sulfo group act on the organic films lying on the surfaces of the electrodes to decompose the organic films 6 and 11 in the electrode connection step.

For example, preferably, the content of the resin having the organic film decomposing component is 2% by weight or more relative to the base material of the adhesive.

FIG. 4 schematically shows a state in which the organic film decomposing component has acted on the organic films 6 and 11. As shown in the drawing, since the organic films 6 and 11 are decomposed by the organic film decomposing component, the real thickness of the organic films 6 and 11 can be decreased or the strength can be decreased. Therefore, the edges of the conductive particles 8 break through the organic films 6 and 11 and easily reach the surfaces of the connecting electrodes 2 and 10, and reliable electrical connection can be achieved.

Note that FIG. 4 schematically shows the principle of the present invention, in which the organic films 6 and 11 partially remain. However, all of the organic films 6 and 11 can be decomposed and disappear. Furthermore, it is also possible to decrease the strength by softening or the like without changing the thickness of the organic films.

The organic film decomposing component is not limited to a component that has the carboxyl group in a natural state. It is also possible to mix a resin component that generates the carboxyl group by heating.

Furthermore, in the case where an epoxy resin is used as the base material 9a of the conductive adhesive, by using an acid anhydride-base curing agent and by heating, the carboxyl group can be generated. A carboxylic acid anhydride is a compound produced by dehydration synthesis of two carboxylic acid molecules, and has the carboxyl group. By mixing a curing agent containing a carboxylic acid anhydride, such as maleic acid anhydride, phthalic anhydride, succinic anhydride, or pyromellitic dianhydride, and by using heat applied in the step of temporarily bonding the conductive adhesive or the step of connecting the rigid printed circuit board 1 and the flexible printed circuit board 3 to each other to generate the organic film decomposing component, the organic films 6 and 11 can be decomposed by the action of the generated organic film decomposing component.

Furthermore, in the case where a resin component containing the carboxylic acid anhydride is used, by mixing a resin component containing a tertiary amine group or an imidazole group, the carboxy group formation reaction can be promoted.

Figure 5:
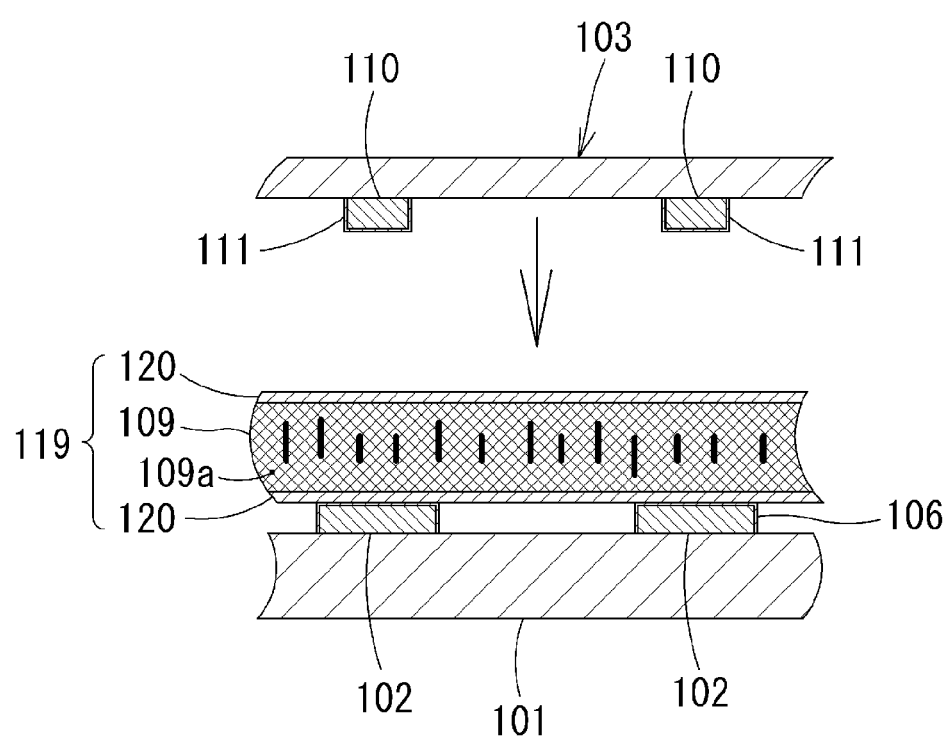
FIG. 5 is a view showing a connection step according to a second embodiment and is an enlarged cross-sectional view corresponding to FIG. 2.
Figure 6:
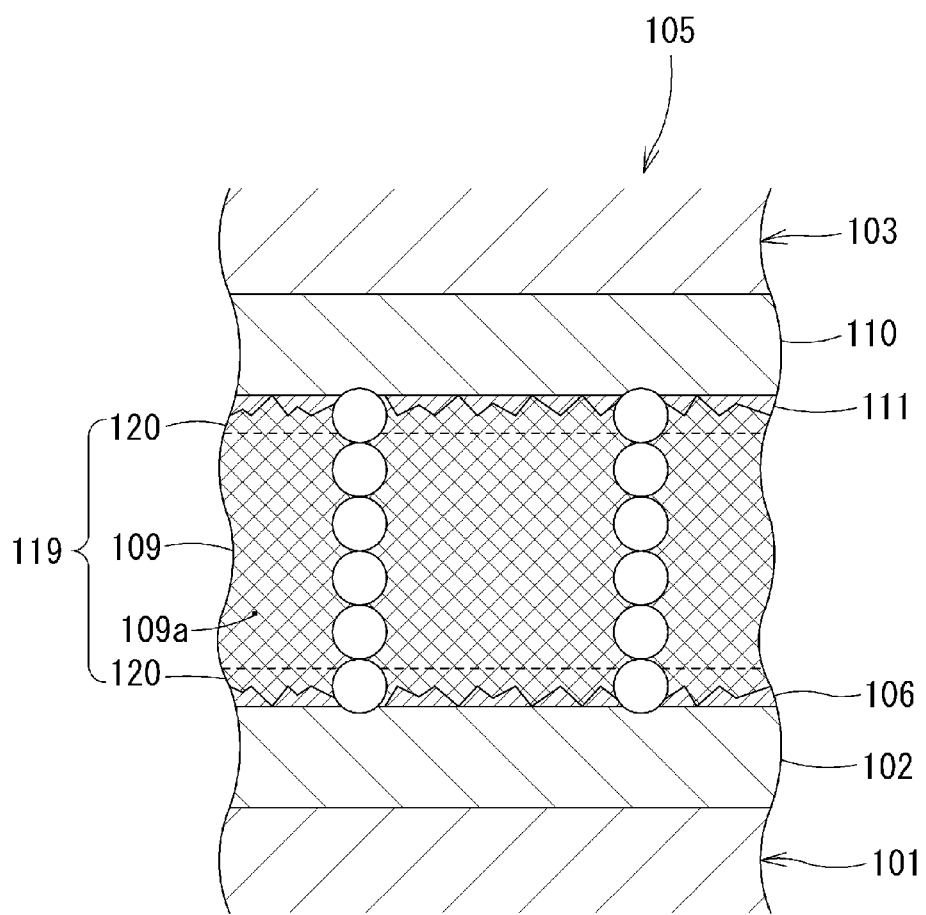
FIG. 6 is an enlarged cross-sectional view schematically showing a connection structure according to the second embodiment.

FIGS. 5 and 6 show a second embodiment of the present invention. In this embodiment, resin films 120 having an organic film decomposing component are stacked onto both sides of an epoxy resin film 109 in which conductive particles are mixed to constitute a multilayered film-shaped conductive adhesive 119. Since the connection method is the same as that in the first embodiment shown in FIG. 2, a description thereof will be omitted.

As the films 120 having an organic film decomposing component, acrylic resin films can be used. By using this structure, in the film-shaped adhesive 119, the organic film decomposing component can be unevenly distributed and concentrated on portions to be brought into contact with the organic films 106 and 111. Consequently, the organic films 106 and 111 can be efficiently decomposed. In FIG. 6, in order to facilitate understanding, the acrylic resin films 120 are expressed as imaginary layers. However, in the electrode connection step, the acrylic resin films 120 are melted and integrated into the epoxy resin film 109.

The method of unevenly distributing the organic film decomposing component so as to be concentrated on a portion of the conductive adhesive to be brought into contact with the organic film is not limited to the second embodiment described above. For example, by applying a carboxyl group-containing acrylic resin solution by coating onto the surface of the film-shaped conductive adhesive to be brought into contact with the organic film, the organic film decomposing component can be unevenly distributed and concentrated on the surface of the conductive adhesive. Furthermore, it is also possible to mix the organic film decomposing component with a concentration gradient such that the concentration is high on the surface side.

Examples and Comparative Example will be described below. It is to be understood that the present invention is not limited to Examples.

Example 1

Production of Conductive Adhesive

As conductive particles, linear nickel fine particles were used, in which the major axis length L distribution was 1 to 10 μm, the average thereof was 3 μm, the minor axis R distribution was 0.1 to 0.4 μm, and the average thereof was 0.2 μm. In this example, the aspect ratio of the conductive particles is 15. As insulating thermosetting resins, two types of bisphenol-A-type solid epoxy resin [(1) trade name: Epikote 1256 manufactured by Japan Epoxy Resins Co., Ltd. and (2) Epikote 1004], and a naphthalene-type epoxy resin [(3) trade name: EPICLON 4032D manufactured by Dainippon Ink and Chemicals, Inc.] were used. Furthermore, a thermoplastic polyvinyl butyral resin [(4) trade name: S-LEC BM-1 manufactured by Sekisui Chemical Co., Ltd.] was used. As a microcapsule-type latent curing agent, (5) a microcapsule-type imidazole-base curing agent [trade name: NOVACURE HX3941 manufactured by Asahi Kasei Epoxy Co., Ltd.] was used. Furthermore, as an organic film decomposing component, (6) a carboxylated acrylic resin (trade name: Fine Sphere FS-201 manufactured by Nippon Paint Co., Ltd.) was added. The materials (1) to (6) were mixed at a ratio of (1)35/(2)20/(3)25/(4)10/(5)30/(6)10 by weight.

The epoxy resins, the thermoplastic resin, the latent curing agent, and the organic film decomposing component were dissolved and dispersed in cellosolve acetate, followed by kneading with a triple-roll mill. Thereby, a solution with a solid content of 50% by weight was produced. The Ni powder was added to the solution such that the metal filling factor represented by the ratio of the amount of metal to the total amount of the solid contents (Ni powder+resins) was 0.05% by volume, and then, the Ni powder was uniformly dispersed with a centrifugal mixer. Thereby, a composite material for adhesive was produced. Next, the composite material was applied, using a doctor knife, onto a PET film that had been subjected to mold release treatment, and then dried and solidified, in a magnetic field with a flux density of 100 mT, at 60° C. for 30 minutes. Thereby, a film-shaped conductive adhesive with a thickness of 35 μm having anisotropic conductivity was produced, in which linear particles in the film were aligned in the magnetic field direction.

(Production of Printed Circuit Board)

A flexible printed circuit board was prepared, in which 30 connecting electrodes, each having a width of 150 μm, a length of 4 mm, and a height of 18 μm, were arranged at an interval of 150 μm. An oxidation-preventing film containing 2-phenyl-4-methyl-5-benzyimidazole was formed on the connecting electrodes. The oxidation-preventing film had a thermal decomposition temperature of 310° C. and an average thickness of 0.60 μm, and the area ratio of the region with a thickness of 0.1 μm or less was 2%.

(Evaluation of Connection Resistance)

The flexible printed circuit board was subjected to a solder reflow process at a peak temperature of 260° C. in a tank of a reflow furnace, the oxygen concentration of which was set at 1% or less by nitrogen flow. Then, flexible printed circuit boards were arranged to face each other so as to form a daisy chain in which it was possible to measure the connection resistance for continuous 30 points. The conductive adhesive produced as described above was placed between the flexible printed circuit boards, and bonding was performed by pressing at a pressure of 5 MPa for 15 seconds while heating at 190° C. Thereby, a joint structure of flexible printed circuit boards was obtained. Next, in the joint structure, with respect to the stacked body including the upper and lower connecting electrodes and the conductive adhesive interposed therebetween, the resistance was measured for the 30 points by a four-terminal method. The resulting value was divided by 30 to determine a connection resistance per point of connection. When the connection resistance was 50 mΩ or less, it was determined that conductivity was ensured.

(Evaluation of Connection Reliability)

The joint structure produced as described above was left to stand in a high-temperature, high-humidity tank at 85° C. and 85% RH for 500 hr, and then the connection resistance was measured in the same manner as above. When the rate of increase in connection resistance was 50% or less, connection reliability was evaluated to be good.

Example 2

As an organic film decomposing component, (7) tetrahydrophthalic anhydride (trade name: EPICLON B-570H manufactured by Dainippon Ink and Chemicals, Inc.) was added, and by mixing the materials (1) to (5) and (7) at a ratio of (1)35/(2)20/(3)25/(4)10/(5)30/(7)5 by weight, a conductive adhesive according to Example 2 was produced. Except for this, a joint structure was produced in the same manner as that in Example 1.

Comparative Example

As Comparative Example, a joint structure obtained in the same manner as that in Example 1 except that the organic film decomposing component was not mixed in the conductive adhesive was used.

TABLE

| | Initial connection resistance (mΩ) | Rate of increase in resistance (%) |
|---|---|---|
| Example 1 | 48 | 8 |
| Example 2 | 46 | 4 |
| Comparative Example 1 | 150 | ∞ |

(Evaluation Results)

As is evident from Table, in the case where the organic film decomposing component is mixed, each of the initial connection resistance and the rate of increase in resistance decreases.

The scope of the present invention is not limited to the embodiments described above. It should be understood that the embodiments disclosed herein are illustrative and not restrictive in all respects. The scope of the present invention is defined by the claims rather than by the above description, and is intended to include all modifications within the equivalent meaning and scope of the claims.

INDUSTRIAL APPLICABILITY

In an electrode connection structure, even in the case where an organic film used as an oxidation-preventing film is hardened in a solder reflow step in which electronic components are connected, reliable electrical connection can be secured.

REFERENCE SIGNS LIST

2 first connecting electrode
6 organic film 9 conductive adhesive
10 second connecting electrode
11 organic film

The invention claimed is:

1. An electrode connection method in which a first connecting electrode and a second connecting electrode are connected together through a conductive adhesive that is interposed between the electrodes, the method comprising:
    an organic film formation step in which an organic film is formed on at least a surface of the first connecting electrode by subjecting the surface of the first connecting electrode to a water-soluble preflux treatment; and
    an electrode connection step in which the first connecting electrode and the second connecting electrode are connected together through the conductive adhesive,
    wherein, in the electrode connection step, by allowing an organic film decomposing component mixed in the conductive adhesive to act on the organic film, the organic film is decomposed, and thus connection between the connecting electrodes is performed.

2. The electrode connection method according to claim 1, wherein the first connecting electrode is formed on a circuit board on which an electronic component is to be mounted, and the method includes, after the organic film formation step, an electronic component connection step in which the electronic component is connected to the circuit board by a solder reflow process.

3. The electrode connection method according to claim 1, wherein the organic film decomposing component is a resin component having at least one of a carboxyl group, a mercapto group, and a sulfo group.

4. The electrode connection method according to claim 1, wherein the organic film decomposing component is generated by heating the conductive adhesive in the electrode connection step.

5. An electrode connection structure in which a first connecting electrode and a second connecting electrode are connected together through a conductive adhesive, the electrode connection structure comprising:
    an organic film formed on at least the first connecting electrode; and
    a conductive adhesive layer disposed between the connecting electrodes,
    wherein the conductive adhesive contains an organic film decomposing component which decomposes the organic film and wherein the organic film decomposing component is a resin component having at least one of a carboxyl group, a mercapto group, and a sulfo group.

6. A conductive adhesive comprising:
    an adhesive component containing a thermosetting resin;
    conductive particles; and
    an organic film decomposing component which decomposes an organic film disposed on a connecting electrode, wherein the organic film decomposing component is a resin component having at least one of a carboxyl group, a mercapto group, and a sulfo group.

7. The conductive adhesive according to claim 6, wherein the conductive adhesive contains a resin component which generates the organic film decomposing component by heating.

8. The conductive adhesive according to claim 6, wherein the conductive particles are composed of metal powder having a form in which many fine metal particles are linearly joined to each other or having an acicular shape.

9. The conductive adhesive according to claim 6, wherein the conductive particles have an aspect ratio of 5 or more.

10. The conductive adhesive according to claim 6, wherein the conductive adhesive is film-shaped.

11. The conductive adhesive according to claim 10, wherein, in the film-shaped adhesive, the organic film decomposing component is unevenly distributed and concentrated on at least a portion to be brought into contact with the organic film.

12. The conductive adhesive according to claim 10, wherein the major axis direction of the conductive particles is aligned in the thickness direction of the film-shaped adhesive.

13. An electronic device comprising an electrode connection structure in which electrodes having an organic film are connected together by means of the conductive adhesive according to claim 6.

* * * * *